United States Patent
Hashoian et al.

(10) Patent No.: US 6,438,402 B1
(45) Date of Patent: Aug. 20, 2002

(54) STEP-TAPERED FLEXIBLE PERIPHERAL COIL

(75) Inventors: Ralph Hashoian, Brookfield; Janette A. Bluma, Pewaukee, both of WI (US)

(73) Assignee: IGC-Medical Advances, Inc., Milwaukee, WI (US)

( * ) Notice: Subject to any disclaimer, the term of this patent is extended or adjusted under 35 U.S.C. 154(b) by 0 days.

(21) Appl. No.: 09/190,697

(22) Filed: Nov. 12, 1998

(Under 37 CFR 1.47)

Related U.S. Application Data

(60) Provisional application No. 60/066,242, filed on Nov. 20, 1997.

(51) Int. Cl.[7] .................................................. A61B 5/05
(52) U.S. Cl. ........................ 600/410; 600/421; 600/422; 324/318; 324/319; 324/320; 324/322
(58) Field of Search ................................ 600/422, 401, 600/410, 421, 13; 324/318, 319, 320, 322, 300, 307, 309

(56) References Cited

U.S. PATENT DOCUMENTS

| | | | |
|---|---|---|---|
| 5,049,821 A | * 9/1991 | Duensing et al. | 324/322 |
| 5,430,378 A | 7/1995 | Jones | 324/318 |
| 5,435,302 A | 7/1995 | Lenkinski et al. | 128/653.5 |
| 5,548,218 A | 8/1996 | Lu | 324/318 |
| 5,594,337 A | * 1/1997 | Boskamp | 324/318 |
| 5,666,055 A | * 9/1997 | Jones et al. | 324/318 |
| 5,682,098 A | * 10/1997 | Vij | 324/318 |
| 5,924,987 A | * 7/1999 | Meaney et al. | 600/420 |
| 6,137,291 A | * 10/2000 | Sazumowski et al. | 324/318 |

* cited by examiner

Primary Examiner—Marvin M. Lateef
Assistant Examiner—Jeoyuh Lin
(74) Attorney, Agent, or Firm—Quarles & Brady LLP

(57) ABSTRACT

A flexible peripheral coil for magnetic resonance imaging provides a tapered volume conforming to a patient through the use of multiple flexible leaves of decreasing combined length which enclose progressively smaller cylindrical areas while maintaining correct coil orientation. A freestanding foot coil may be placed over the patient's foot with toes passing through an aperture in the coil to complete the scanning coverage area. Straps allow the various coil leaves to accommodate different body sizes effectively varying the taper of the coil.

9 Claims, 3 Drawing Sheets

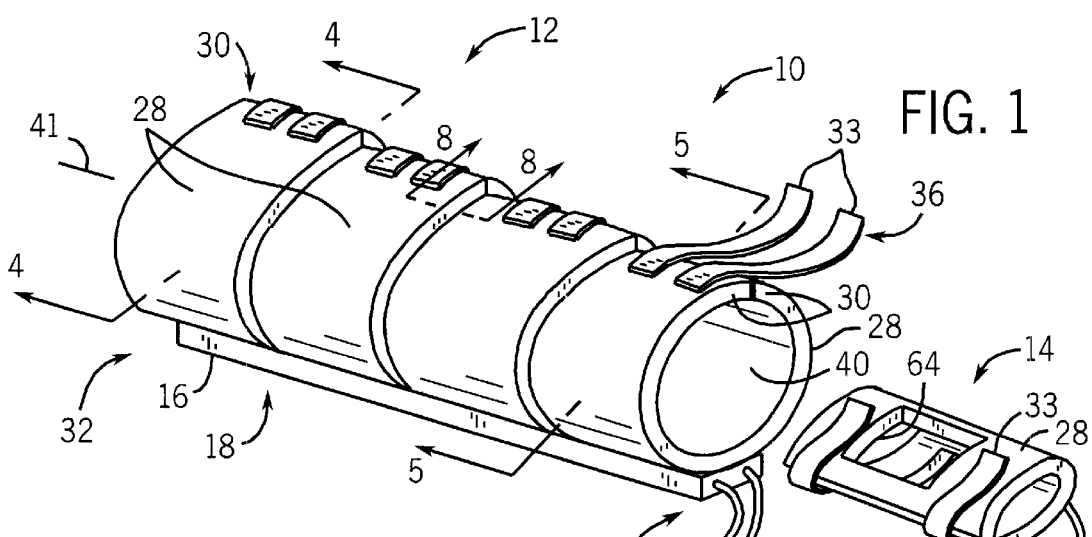
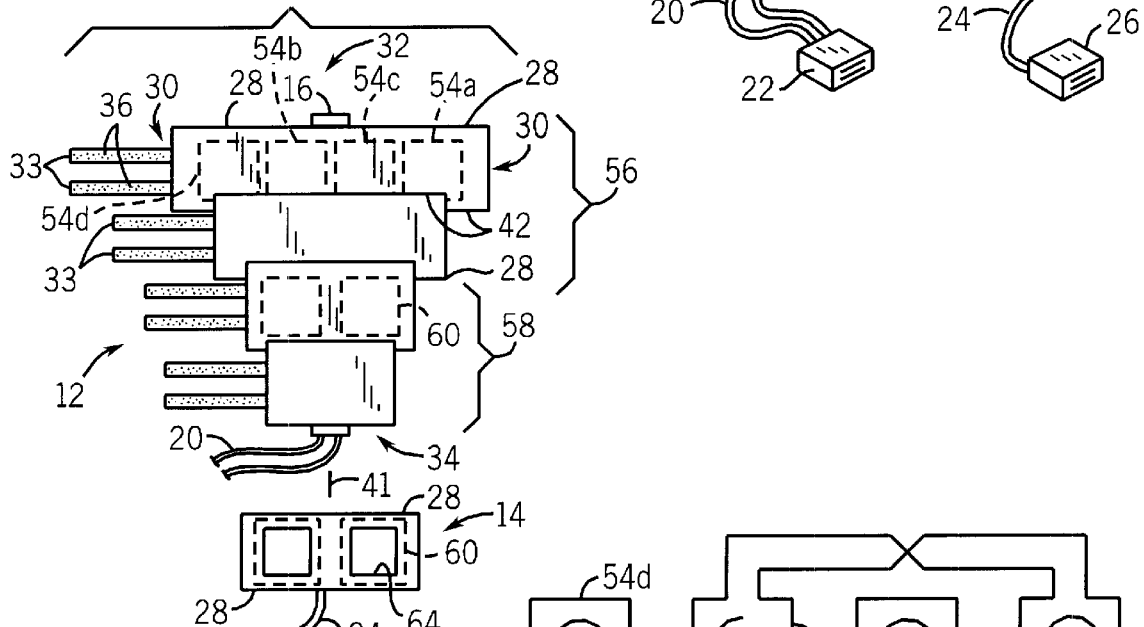
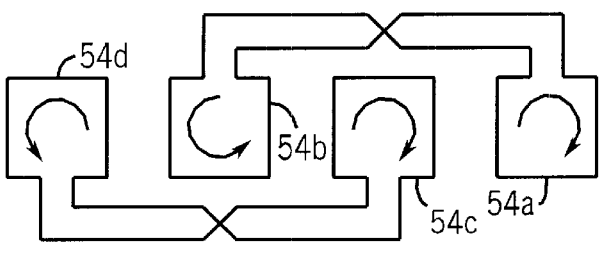
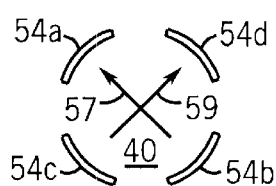

STEP-TAPERED FLEXIBLE PERIPHERAL COIL

CROSS-REFERENCE TO RELATED APPLICATIONS

This application claims the benefit of provisional application No. 60/066,242 filed Nov. 20, 1997 and hereby incorporated by reference.

STATEMENT REGARDING FEDERALLY SPONSORED RESEARCH OR DEVELOPMENT

BACKGROUND OF THE INVENTION

The field of the invention is magnetic resonance imaging (MRI) and, in particular, local coils for use in magnetic resonance angiography (MRA).

A. MRI Imaging

In MRI, a uniform magnetic field Bo is applied to an imaged object along the z-axis of a Cartesian coordinate system fixed with respect to the imaged object. The effect of the magnetic field Bo is to align the object's nuclear spins along the z-axis.

In response to a radio frequency (RF) excitation signal of the proper frequency oriented within the x-y plane, the nuclei precess about the z-axis at their Larmor frequencies according to the following equation:

$$\omega = \gamma B0 \quad (1)$$

where $\omega$ is the Larmor frequency, and $\gamma$ is the gyromagnetic ratio which is a constant and a property of the particular nuclei. The component of the nuclear spins aligned with the x-y plane is termed the transverse magnetization.

The rate of decay of the transverse magnetization differs for different tissues and hence may be used to distinguish among tissue in an MRI image. Hydrogen, and in particular the nucleus (protons) because of its relative abundance in biological tissue and the properties of its nuclei, is of principle concern in such imaging. The value of the gyromagnetic ratio g for protons is 4.26 kHz/gauss and therefore in a 1.5 Tesla polarizing magnetic field Bo, the resonant or Larmor frequency of protons is approximately 63.9 MHz.

In a typical imaging sequence for an axial slice, the frequency of the RF excitation signal is centered at the Larmor frequency of the protons and applied to the imaged object at the same time as a magnetic field gradient Gz is applied. The gradient field Gz causes only the nuclei, in a slice with a limited width through the object along an x-y plane, to be excited into resonance.

After the excitation of the nuclei in this slice, magnetic field gradients are applied along the x and y axes. The gradient along the x-axis, Gx, causes the nuclei to precess at different frequencies depending on their position along the x-axis, that is, Gx spatially encodes the precessing nuclei by frequency. The y axis gradient, Gy, is incremented through a series of values and encodes the y position into the rate of change of phase of the precessing nuclei as a function of gradient amplitude, a process typically referred to as phase encoding.

A weak nuclear magnetic resonance generated by the precessing nuclei may be sensed by the RF coil and recorded as an NMR signal. From this NMR signal, a slice image may be derived according to well known reconstruction techniques. An overview of NMR image reconstruction is contained in the book "Magnetic Resonance Imaging, Principles and Applications" by D. N. Kean and M. A. Smith.

B. Angiography

The delay between the RF excitation and the recording of the NMR data may be used to detect and measure the flow of blood in blood vessels and thereby to detect obstructions and to distinguish the blood vessels from stationary tissue as demarcated by the flowing blood.

Such flow measurement may be made most simply by selectively exciting the spins in a given location and measuring the transverse magnetization of the spins at a downstream location a short while later. Examples of this "time of flight" technique are described in U.S. Pat. Nos. 3,559,044; 3,191,119; 3,419,793 and 4,777,957, hereby incorporated by reference. A variation of this technique notes the change of transverse magnetization in the region excited by the RF pulse. Examples of this method are described in U.S. Pat. Nos. 4,574,239; 4,532,474; and 4,516,582; also incorporated by reference. A third technique measures flow by making use of the fact that spins moving in a gradient magnetic field experience a phase shift. This technique is described in U.S. Pat. Nos. 4,609,872 and 5,281,916, hereby incorporated by reference.

C. Local Coils

The quality of the image produced by MRI techniques is dependent, in part, on the strength of the NMR signal received from the precessing nuclei. For this reason, it is known to use an independent RF receiving coil placed in close proximity to the region of interest of the imaged object in order to improve the strength of this received signal. Such coils are termed "local coils" or "surface coils". The smaller area of the local coil permits it to accurately focus on NMR signals from the region of interest. Further, the RF energy of the field of such a local coil is concentrated in a smaller volume giving rise to improved signal-to-noise ratio in the acquired NMR signal.

The signal-to-noise ratio of the NMR signal may be further increased by employing a coil that is sensitive to RF energy along both of a pair of mutually perpendicular axes. This technique is generally known as quadrature detection and the signals collected are termed quadrature signals.

The outputs of the quadrature coil pairs are combined so as to increase the strength of the received signal according to the simple sum of the output signals corrected for phase shift from the coils. The strength of the uncorrelated noise component of these signals, however, will increase only according to the square root of the sum of the squares of the noise components. As a result, the net signal-to-noise ratio of the combined quadrature signals increases by approximately $\sqrt{2}$ over the signal-to-noise ratio of the individual signal.

The quadrature orientation of the two coils introduces a 90° phase difference between the NMR signals detected by these coils. Therefore, combining the outputs from the two quadrature coils, to achieve the above described signal-to-noise ratio improvement, requires that one signal be shifted to have the same phase as the other signal so that the amplitudes of the signals simply add.

Such phase shifting and combining is typically accomplished by means of a hybrid network. Hybrid networks are four-port networks known in the art and having the property that when the four ports are properly terminated, energy input to two of the ports, with the proper relative phase angles, will be combined at one of the remaining two ports. The antenna coils are attached to two of the ports and the output lead is attached to a third port and produces the sum of the signals from the antenna coils, one being shifted so that they add in-phase. The remaining uncommitted port is connected to a termination resistor.

As used herein, the term quadrature coil and quadrature signal, will refer to the detecting of the NMR signal along multiple axes and combining the signals so collected, with the appropriate phase shifts to produce a signal of improved signal-to-noise ratio.

1. Volumetric Local Coils

One method of constructing a local coil is the "bird cage" construction in which two conductive loops are spaced apart along a common longitudinal axis and interconnected by a series of regularly spaced longitudinal connectors. The impedance of the loops and of the longitudinal conductors is adjusted so that the coil may be excited into resonance by a rotating transverse magnetic field at the Larmor frequency. A quadrature signal may be obtained by monitoring the current through two longitudinal conductors spaced at 90° around the periphery of the loops. Such coils are described in detail in U.S. Pat. Nos. 4,680,548, 4,692,705, 4,694,255 and 4,799,016.

The use of volumetric local coils of conventional bird cage or other quadrature design may be undesirably constraining to the patient who must be surrounded by the relatively small volume of the coil. The use of a conventional volumetric coil for angiographic imaging of the lower extremities would require threading the patient's feet through a relatively long tubular structure—a procedure that may be difficult or impossible for many patients.

For this reason it is known to produce an angiographic coil having flexible side panels supporting the coils, the side panels being folded around the supine patient after the patient is centered on the coil. See U.S. Pat. No. 5,594,337 assigned to the same assignee as the present invention and hereby incorporated by reference.

BRIEF SUMMARY OF THE INVENTION

The present invention provides an angiographic coil that better conforms to patients with different body habitus and that provide improved coil orientation throughout its range of adjustments. Generally, side panels of the coil are broken into a number of flexible leaves which may be individually wrapped about the patient. The leaves allow taper in the overall coil form, and an ability to adjust this taper while maintaining the individual coils parallel to the longitudinal axis of the coil.

Specifically, the present invention provides an MRI coil for imaging the lower trunk and legs of a patient. The coil includes a base sized to fit against a table of an MRI machine, extending along a longitudinal axis and having transversely opposed left and right sides. A plurality of flexible coil leaves extend transversely from the left and right sides in opposed pairs, the pairs having progressively decreasing combined lengths from a first longitudinal end of the base to a second longitudinal end of the base. The pairs may be wrapped around a supine patient positioned on the base to form enveloping coils of progressively decreasing diameters.

Thus it is one object of the invention to provide a tapered coil that maintains proper coil orientation of each coil element. This orientation is maintained by breaking the flexible panels into leaves each which may be adjusted individually while maintaining parallel orientation.

First ends of the flexible coil leaves, opposed to second ends attached to the base, may hold adjustable fasteners attaching the first ends of each pair together when they envelope a patient.

Thus it is another object of the invention to provide a tapered coil whose effective taper may be adjusted without disrupting the proper orientation of the coils in the adjustment process. A tipping of the coils can cause undesired coupling between coils.

The flexible coil leaves may include conductors surrounding a coil area. Adjacent flexible coil leaves are attached to the left and right sides of the base so that their coil areas overlap along the longitudinal direction.

Thus it is another object of the invention to provide a multi-leaf, flexible coil having electrical isolation of adjacent coils. overlapping the coil areas reduces coupling between the coils as is necessary for high quality imaging.

A first and second flexible coil leaf may incorporate a flexible support attached at one end to a transverse side of the base to support the conductors. An inner resilient pad may be attached to a first face of the flexible support facing the patient when the coil leaf envelops the patient. The flexible supports of the first and second flexible coil leaf overlap at corresponding first and second transverse edges and the inner resilient pad of the first flexible coil leaf is inset from the first transverse edge and the resilient pad of the second conductor extends to abut the inner resilient pad of the first flexible coil providing a substantially continuous inner padded layer.

Thus it is another object of the invention to allow overlapping flexible coil leaves providing the above benefits and with continuous padding to the patient.

The MRI coil may include a foot coil attached to the second longitudinal end of the base, the foot coil having a first and second transversely extending flexible coil leaf having a smallest combined length of all leaves wherein at least one of the flexible coil leaves has an aperture allowing exit of the patient's toes when the flexible coil leaves are wrapped around a patient's foot.

Thus it is another object of the invention to provide a peripheral angiographic coil that may conform closely to the patient's body despite the need to accommodate the patient's toes. An aperture in the foot coil allows its leaves to be closely wrapped about the patient's ankle.

Other objects and advantages besides those discussed above will be apparent to those skilled in the art from the description of the preferred embodiment of the invention which follows. Thus, in the description, reference is made to the accompanying drawings, which form a part hereof, and which illustrate one example of the invention. Such example, however, is not exhaustive of the various alternative forms of the invention. Therefore, reference should be made to the claims which follow the description for determining the full scope of the invention.

BRIEF DESCRIPTION OF THE SEVERAL VIEWS OF THE DRAWINGS

FIG. 1 is a perspective view of the coil of the present invention in its closed state showing the multi-leafed step-tapered main coil and a separate foot coil with aperture together with connecting cables;

FIG. 2 is a top plan view of the coils of FIG. 1 in open state with the leaves substantially planar showing coil conductors in outline on the first and third leaf pair of the main coil;

FIG. 3 is a schematic representation of the coil conductors of the first leaf pair in the open configuration;

FIG. 4 is a simplified cross-section of the first leaf pair in the closed configuration along line 4—4 of FIG. 1;

DETAILED DESCRIPTION OF THE INVENTION

Figure 5:
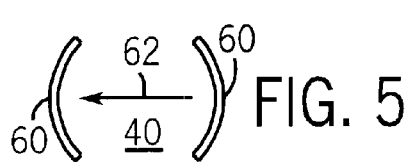
FIG. 5 is a figure similar to that of FIG. 4 of the third leaf pair taken along line 5—5 of FIG. 1.

Referring now to FIG. 1, an angiographic coil 10 includes a main coil 12 and a foot coil 14. The main coil 12 provides a longitudinally extending base 16 having a lower surface 18 conforming to the upper surface of a patient support table (not shown) so that the base may fit against the top of the table. The base 16 is constructed of a rigid polymer having a high dielectric strength and non-magnetic properties.

The base 16 incorporates circuitry well known in the art for combining signals from coil conductors of the main coil 12. Cables 20 exit one end of the base 16 to connect the circuitry of the base 16 to a connector 22 that may be received by the signal processing electronics of an MRI system. A similar cable 24 and connector 26 extend from the foot coil 14.

Referring also to FIG. 2, attached to the left and right transverse side of the base 16 are a set of flexible leaves 28 extending transversely from the base 16 and arranged in opposing pairs across base 16. The leaves 28 of each pair overlap with adjacent pairs of leaves 28 at transverse edges 42. This overlap causes overlap in the area of the coils on the leaves and decreases coil coupling to provide improved homogeneity in the reception pattern of the coils as will be described below. Each of the leaves 28 may be folded upward to a closed state so that its free longitudinal edge 30 abuts a corresponding free longitudinal edge 30 of the opposite leaf 28 of its pair. When so folded, each pair of leaves surround a generally cylindrical volume above the base 16.

Straps 33 are attached to one longitudinal edge 30 of each of the opposed leaves 28. The straps 33 have a fastening material such as Velcro hook material 36 on an inner face that may connect to a Velcro loop material (not shown) on the longitudinal edge 30 of the opposite leaf 28 so that the leaves 28 of each opposed pair may be held about the patient. The length of the straps 33 is such that some variation in the proximity of the longitudinal edges 30 of the leaves 28 may be obtained.

Four leaf pairs are attached to the base 16, the first leaf pair being at an abdominal end 32 of the base 16 near the patient's abdomen when the patient is properly positioned on the base. The first leaf pair has the greatest combined transverse length of leaves 28 so that the volume enclosed when the longitudinal edges 30 of the leaves 28 abut is greater than a similar volume enclosed by the leaves 28 of the other pairs. Moving from the abdominal end 32 of the base 16 to a foot end 34 of the base 16, the combined length of 10 the leaves 28 decreases so that their enveloped volumes decrease to generally conform to the decreased cross-sectional area of the patient at these various points above the base 16.

The different lengths of the multiple leaves 28 provide a step-tapered inner volume 40 to the angiographic coil 10 so that it conforms well to a typical patient. Nevertheless, the straps 33 allow adjustments in the individual leaves 28 so that different amounts of taper or sizing may be obtained. In all cases because each set of leaves 28 is individually adjustable, the plane of the surface of the leaves 28 remains generally parallel to a central longitudinal axis 41 of the coil thus providing improved reception and reduced coupling between the coils and will be described.

Figure 8:
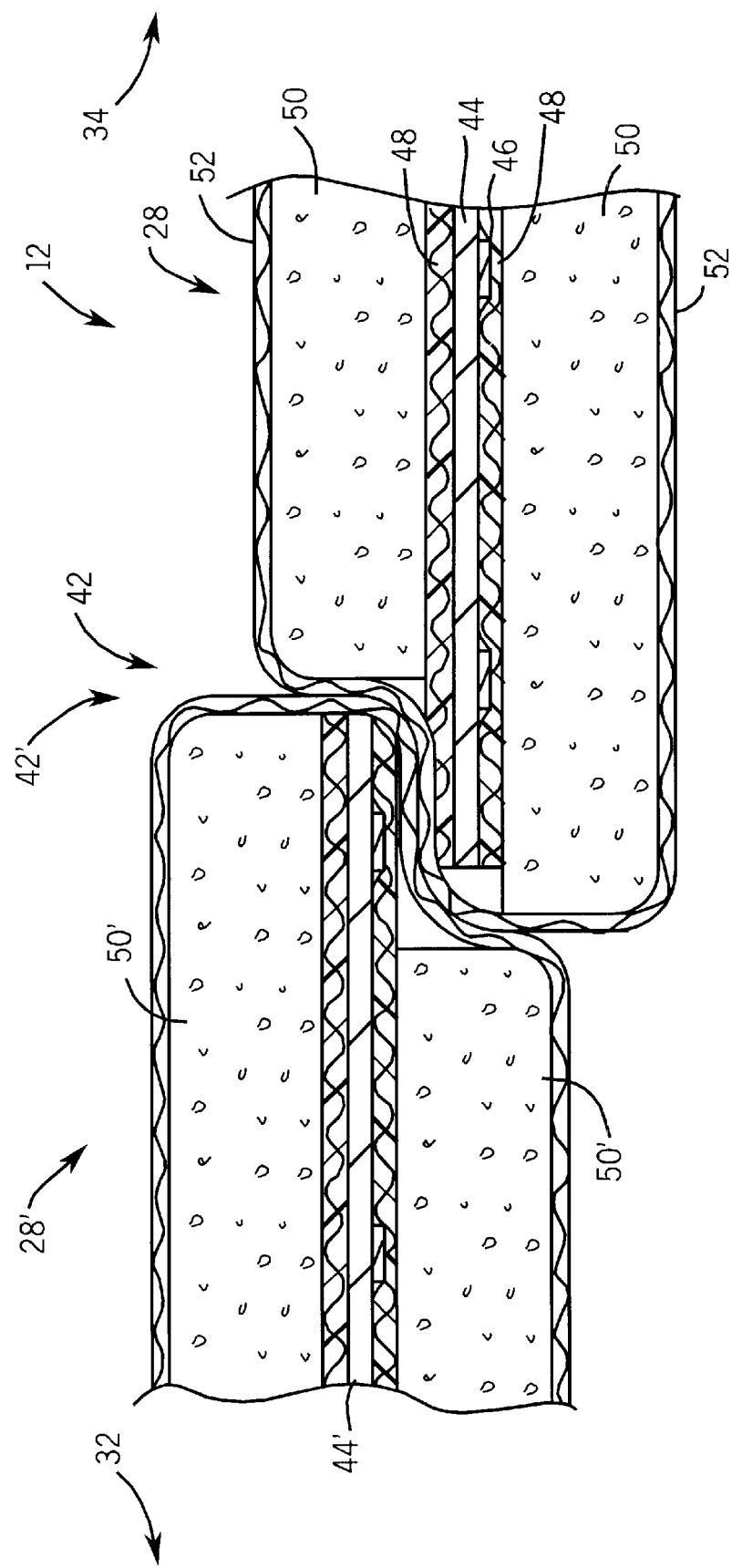
FIG. 8 is a cross-section taken along line 8—8 of FIG. 1 through two adjacent coil leaves showing their overlap.

Referring now to FIG. 8, each leaf 28 is constructed of an inner layer of flexible circuit board material 44 having on its inner surface (toward the patient when the angiographic coil 10 is in a closed state) a copper conductor 46 forming the coil structure of the main coil 12 and foot coil 14 as will be described in more detail below. Surrounding the flexible circuit material and copper conductor 46 are layers of Teflon coated fabric 48 providing an electrical barrier and a protective low friction surface that reduces binding with the further layers of the leaf 28. On either side of the Teflon coated fabric 48 are polyethylene foam pads 50 providing cushioning to the patient. These layers in turn are encased in a fabric cover 52.

Referring to FIGS. 2 and 8, as described, the transverse edges 42 of the leaves 28 overlap and in particular, transverse edges of the flexible circuit material overlap so that the area circumscribed by the copper conductors 46 overlap to provide electrical isolation. In order to provide a continuous padded surface for the patient, the inner foam pad 50 for the transverse edges toward the abdominal end 32 extends all the way to the edge of the flexible circuit board material 44 for all leaf pairs. On the opposing transverse edges 42 toward the foot end 34 of the first, second and third leaf pairs adjacent leaf 28, however, the inner foam pad 50' is inset from the transverse edge 42' by the amount of the overlap so as to provide essentially gapless padding layer facing the patient.

Similarly, the outer foam pad 50' on the transverse edges 42' facing the foot end 34 extends all the way to the transverse edge 42 of the flexible circuit board material 44' on all leaf pairs. Conversely, the outer foam pad 50 of facing transverse edges 42 of leaf pairs two, three and four are inset from the transverse edges 42. Accordingly, the padding provided by foam pad 50 and 50' is essentially gapless for the length of the main coil 12.

Referring now to FIGS. 2 and 3, the upper leaf pairs 56 (leaf pairs one and two) support four conductor coils 54, formed of the copper conductors 46, are displaced evenly along the transverse extent of the leaves 28 so that two coils 54(d) and 54(b) extend on the right side of the base 16 and two coils 54(c) and 54(a) extend from the left side of the base 16. Referring to FIG. 4, when the leaf pairs are in the closed configuration about the patient, the two coils 54(a) and 54(b) are opposed about the volume 40 along axis 57 at an angle of approximately forty-five degrees from vertical and two coils 54(c) and 54(d) are opposed about the volume 40 along axis 59 at a perpendicular angle to axis 57.

Referring to FIG. 3, coils 54(a) and 54(b) are connected as a Helmholtz pair to detect NMR signals aligned with axis 57 whereas coils 54(c) and 54(d) are connected as a Helmholtz pair to detect NMR signals along perpendicular axis 59. Thus, these coils 54 together provide quadrature NMR signals which may be combined to a single low-noise signal related to the specific volume enclosed by the coils 54.

Figure 6:
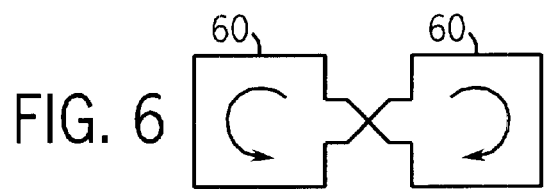
FIG. 6 is a schematic representation of the coil conductors of the third leaf pair in the open configuration.

Referring now to FIGS. 2, 5 and 6, lower leaf pairs 58 (leaf pairs three and four) attach toward the foot end 34 of the main coil 12 and having a lesser combined length than the upper leaf pairs 56 support only two coils 60 arranged as a single Helmholtz pair in opposition about volume 40 to receive NMR signals along axis 62.

A single signal from each of the leaf pairs, hence two signals from upper leaf pairs 56 and two signals from lower leaf pairs 58 are output through cables 20 to the MRI machine.

Referring again to FIG. 1, an unattached foot coil 14 is constructed similarly to the coils 60 and leaves 28 of lower leaf pairs 58 described with respect to FIG. 2. In distinction to the design of the lower leaf pairs 58 however, the leaves 28 of the foot coil 14 include opposed apertures 64 in the center of the contained coils 60 as shown in FIG. 2. One aperture 64 allows the toes of the patient's foot to extend out of the foot coil 14 (allowing it to be wrapped more tightly about the foot) and the other aperture 64 provides for ventilation.

Foot coil 14 is not permanently affixed to base 16 but may nest within the fourth leaf pair when that coil pair is in the closed state and thus may be easily placed on the patient after the patient is placed within volume 40 of the main coil 12. Foot coil 14 includes straps 33 operating similarly to those on the main coil 12 and a single nonquadrature signal is provided through cable 24 to connector 26 to the MRI machine.

Figure 7:
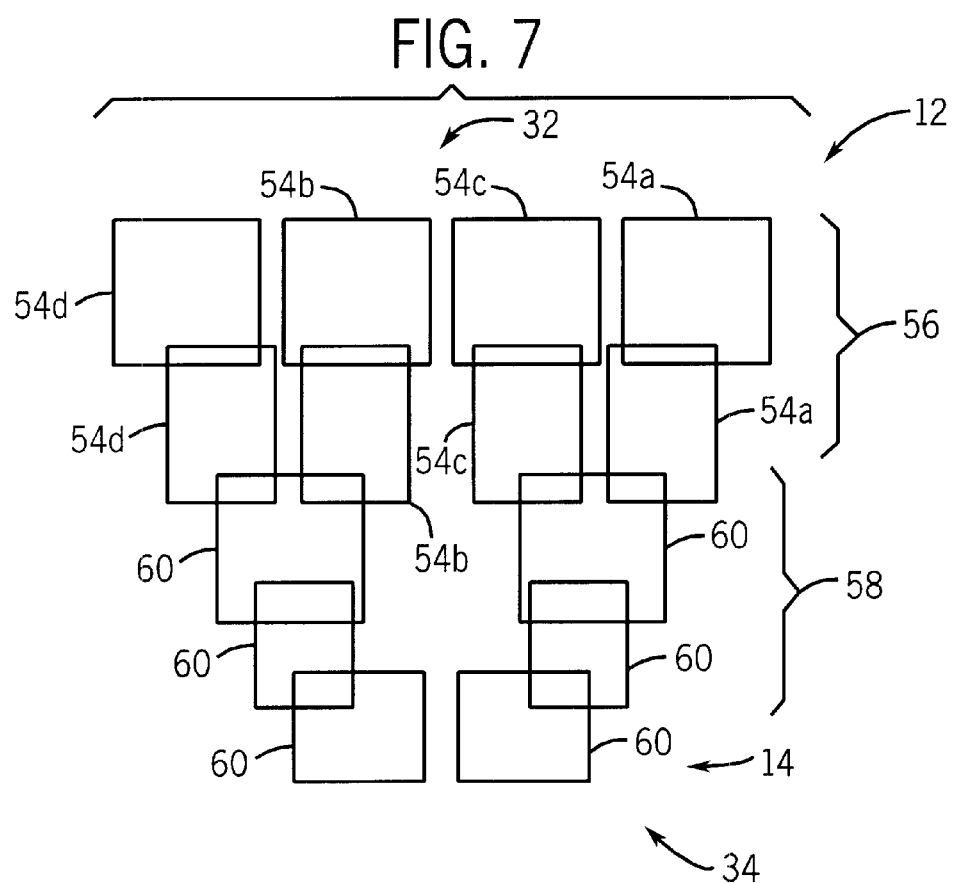
FIG. 7 is a schematic representation of the coil conductors of all leaf pairs and the foot coil in the open configuration showing overlap such as provides electrical isolation.

Referring now to FIG. 7, when the foot coil 14 is placed about the patient, its coil 60 overlaps the coil 60 of the fourth leaf pair at its transverse edge closest to the foot end 34 of the main coil 12. Similarly the coils 60 of the fourth leaf pair overlap with the coils 60 of the third leaf pair and the coils 60 of the third leaf pair each overlap with two of the coils 54 of the lower leaf pairs 58. Thus one coil 60 overlaps with both coils 54(*a*) and 54(*c*) and one coil 60 overlaps with coils 54(*d*) and 54(*b*) of the second leaf pair. Likewise the coils 54(*a*) through 54(*d*) of the second leaf pair overlap with corresponding coils 54(*a*) through 54(*d*) of the first leaf pair closest to the abdominal end 32 of the base 16.

The overlap of the area enclosed by the coils provides uniform coverage of the patient and eliminates electrical coupling between the coils 54 and 60 such as would reduce the signal-to-noise ratio of the signals. The amount of overlap is such as to provide that flux generated by one coil passes through an adjacent coil passes in equal amounts in opposite directions thereby neutralizing any effect on one coil with its neighbor.

The above description has been that of a preferred embodiment of the present invention. It will occur to those that practice the art that many modifications may be made without departing from the spirit and scope of the invention. In order to apprise the public of the various embodiments that may fall within the scope of the invention, the following claims are made:

I hereby claim the apparatus as shown and described above.

I claim:

1. An MRI coil for imaging of the lower trunk and legs comprising:
    a base sized to fit against a table of an MRI machine and extending along a longitudinal axis generally parallel to a length of the table and having opposed left and right sides extending in a transverse direction generally parallel to a width of the table;
    a plurality of pairs of separate flexible coil leaves for containing coil conductors extending transversely from the left and right sides, the leaves of each pair having progressively decreasing combined transverse lengths as one moves from a first longitudinal end of the base to a second longitudinal end of the base;
    whereby in use the leaves wrap around a supine patient positioned on the base to form enveloping coils of progressively decreasing diameters.

2. The MRI coil of claim 1 wherein the flexible coil leaves have first ends which hold adjustable fasteners attaching the first ends of each pair of flexible coil leaves together when they envelop a patient.

3. The MRI coil of claim 1 wherein the flexible coil leaves include conductors surrounding a coil area and wherein adjacent flexible coil leaves are attached to the left and right side of the base so that their coil areas overlap in the longitudinal direction.

4. The MRI coil of claim 1 including a foot coil attached to the second longitudinal end of the base, the foot coil having first and second transversely extending flexible coil leaves having a smallest combined length of all leaves wherein at least one of the flexible coil leaves has an aperture allowing exit of a patient's toes when the flexible coil leaves of the foot coil are wrapped around a patient's foot.

5. The MRI coil of claim 4 wherein the coil leaves of the foot coil overlap one transverse edge of the flexible coil leaves attached at the second longitudinal end of the base.

6. The MRI coil of claim 4 wherein the foot coil is removable from the base.

7. An MRI coil for imaging of the lower trunk and legs comprising:
    a base sized to fit against a table of an MRI machine and extending along a longitudinal axis generally parallel to a length of the table and having opposed left and right sides extending in a transverse direction generally parallel to a width of the table;
    a plurality of pairs of separate flexible coil leaves for containing coil conductors extending transversely from the left and right sides, wherein the flexible coil leaves include conductors surrounding a coil area and wherein adjacent flexible coil leaves are attached to the left and right sides so that their coil areas overlap in the longitudinal direction.

8. The MRI coil as recited in claim 7 wherein at least first and second flexible coil leaves each have:
    a flexible support attached at one edge to a side of the base supporting the conductors;
    an inner resilient pad attached to a first face of the flexible support facing the patient when the flexible coil leaves envelop the patient;
    wherein the flexible conductor support of the first and second flexible coil leaves overlap at corresponding first and second transverse edges and wherein the inner resilient pad of the first flexible coil leaf is inset from the first transverse edge and the resilient pad of the second conductor extends to abut the inner resilient pad of the first flexible coil leaf providing a substantially continuous inner padded layer when the first and second flexible coil leaves are flexed to envelop the patient.

9. The MRI coil as recited in claim 5 having in addition, an outer resilient pad attached to a second face of the flexible support facing away from the patient when the flexible coil leaves envelop the patient;
    wherein the outer resilient pad of the second flexible coil leaf is inset from the second transverse edge and the outer resilient pad of the first conductor extends to abut the resilient pad of the second flexible coil leaf providing a substantially continuous outer padded layer when the first and second flexible coil leaves are flexed to envelop the patient.

* * * * *